(12) United States Patent
Liu et al.

(10) Patent No.: US 9,851,503 B2
(45) Date of Patent: Dec. 26, 2017

(54) COMPACT AND LOW LOSS Y-JUNCTION FOR SUBMICRON SILICON WAVEGUIDE

(71) Applicant: Elenion Technologies, LLC, New York, NY (US)

(72) Inventors: Yang Liu, Elmhurst, NY (US); Yangjin Ma, Brooklyn, NY (US); Ruizhi Shi, New York, NY (US); Michael J. Hochberg, New York, NY (US); Yi Zhang, Elkton (DE); Shuyu Yang, Newark, DE (US); Thomas Wetteland Baehr-Jones, Arcadia, CA (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 15/446,375

(22) Filed: Mar. 1, 2017

(65) Prior Publication Data

US 2017/0235046 A1     Aug. 17, 2017

Related U.S. Application Data

(63) Continuation of application No. 14/834,597, filed on Aug. 25, 2015, now abandoned, which is a
(Continued)

(51) Int. Cl.
| | |
|---|---|
| *G02B 6/26* | (2006.01) |
| *G02B 6/125* | (2006.01) |
| *G02B 6/28* | (2006.01) |
| *G02B 6/10* | (2006.01) |
| *G02B 27/00* | (2006.01) |
| *G06F 17/50* | (2006.01) |

(Continued)

(52) U.S. Cl.
CPC ............ *G02B 6/125* (2013.01); *G02B 6/107* (2013.01); *G02B 6/1228* (2013.01); *G02B 6/2808* (2013.01); *G02B 27/0012* (2013.01); *G06F 17/5009* (2013.01); *G06F 17/5018* (2013.01); *G06F 17/5077* (2013.01); *G06N 3/126* (2013.01); *G02B 6/1223* (2013.01); *G02B 2006/1215* (2013.01); *G02B 2006/12038* (2013.01); *G02B 2006/12061* (2013.01)

(58) Field of Classification Search
USPC ..................................................... 385/15, 45
See application file for complete search history.

(56) References Cited

U.S. PATENT DOCUMENTS

| | | |
|---|---|---|
| 5,091,986 A | 2/1992 | Arii |
| 5,586,209 A | 12/1996 | Matsuura |

(Continued)

OTHER PUBLICATIONS

International Search Report, PCT/US2016/052452, dated Mar. 24, 2017 (9 pages).

(Continued)

*Primary Examiner* — Eric Wong
(74) *Attorney, Agent, or Firm* — Nixon Peabody LLP

(57) ABSTRACT

A compact, low-loss and wavelength insensitive Y-junction for submicron silicon waveguides. The design was performed using FDTD and particle swarm optimization (PSO). The device was fabricated in a 248 nm CMOS line. Measured average insertion loss is 0.28±0.02 dB across an 8-inch wafer. The device footprint is less than 1.2 µm×2 µm, orders of magnitude smaller than MMI and directional couplers.

11 Claims, 7 Drawing Sheets

Related U.S. Application Data continuation of application No. 14/093,263, filed on Nov. 29, 2013, now Pat. No. 9,217,829.

(60) Provisional application No. 61/731,502, filed on Nov. 30, 2012.

(51) Int. Cl.
  *G06N 3/12* (2006.01)
  *G02B 6/122* (2006.01)
  *G02B 6/12* (2006.01)

(56) References Cited

U.S. PATENT DOCUMENTS

| | | | |
|---|---|---|---|
| 6,236,784 | B1 | 5/2001 | Ido |
| 6,792,172 | B1* | 9/2004 | Levy .................... G02B 6/2813 385/15 |
| 7,200,308 | B2 | 4/2007 | Hochberg |
| 7,424,192 | B2 | 9/2008 | Hochberg |
| 7,480,434 | B2 | 1/2009 | Hochberg |
| 7,643,714 | B2 | 1/2010 | Hochberg |
| 7,760,970 | B2 | 7/2010 | Baehr-Jones |
| 9,217,829 | B2 | 12/2015 | Zhang |
| 2003/0113066 | A1 | 6/2003 | Kim |
| 2005/0207705 | A1* | 9/2005 | Laurent-Lund ........ G02B 6/125 385/45 |
| 2006/0039646 | A1 | 2/2006 | Nashimoto |
| 2006/0204175 | A1 | 9/2006 | Laurent-Lund |
| 2006/0278960 | A1 | 12/2006 | Hida |
| 2008/0273829 | A1 | 11/2008 | Saida |
| 2012/0002924 | A1 | 1/2012 | Okayama |
| 2012/0311516 | A1 | 12/2012 | Saida |
| 2013/0330037 | A1 | 12/2013 | Assefa |
| 2014/0007030 | A1 | 1/2014 | Acar |
| 2014/0178005 | A1 | 6/2014 | Zhang |
| 2015/0032250 | A1 | 1/2015 | Chu |

OTHER PUBLICATIONS

Written Opinion of the International Searching Authority, PCT/US2016/052452, dated Mar. 24, 2017 (8 pages).

R. Camacho-Aguilera et al., "An Electrically Pumped Germanium Laser," Optics Express, vol. 20, No. 10, May 2, 2012 (pp. 11316-11320).

G.T. Reed et al., "Silicon Optical Modulators," Nat. Photonics 4, (2010) (21 pages).

J. Michel et al., "High-performance Ge—on—Si Photodetectors," Nature Photonics, Jul. 4, 2010 (pp. 527-534).

Y. Zhang et al., "Silicon Multi-project Wafer Platforms for Optoeletronic System Integration," Proc. 9th IEEE Intern. Conf. GFP, 2012 (3 pages).

A. Sakai et al., "Low Loss Ultra-small Branches in a Silicon Photonic Wire Waveguide," IEICE Trans. Electron. E85-C, No. 4, Apr. 2002 (pp. 1033-1038).

D. Van Thourhout et al., "Functional Silicon Wire Waveguides," Proc. Integrated Photonics Research and Applications, 2006 (4 pages).

Z. Wang et al, "1×8 Cascaded Multimode Interference Splitter in Silicon-on-insulator," Japanese Journal of Applied Physics, vol. 43, No. 8A, 2004 (pp. 5085-5087).

S.H. Tao et al., "Cascaded Wide-angle Y-junction 1×16 Optical Power Splitter Based on Silicon Wire Waveguides on Silicon Insulator," Optics Express, vol. 16, No. 26, Dec. 15, 2008 (pp. 21456-21461).

L.H. Frandsen, et al, "Ultralow-loss 3 dB Photonic Crystal Waveguide Splitter," Optics Letter 29, Aug. 2004 (pp. 1623-1625).

H. Yamade et al., "Optical Directional Coupler Based on Si-wire Waveguides," IEEE Photonics Technology Letters, vol. 17, No. 3, Mar. 2005 (pp. 585-587).

H.C. Nguyen et al., "Compact and Fast Photonic Crystal Silicon Optical Modulators," Optics Express, vol. 20, No. 20, Sep. 24, 2012 (pp. 22465-22474).

P. Sanchis, et al, "Highly Efficient Crossing Structure for Silicon-on-insulator Waveguides," Optics Letters, vol. 34, No. 18, Sep. 15, 2009 (pp. 2760-2762).

J. Kennedy et al., "Particle Swann Optimization," Proc. IEEE Intern. Conf. Neural Networks (1995) (7 pages).

J. Robinson et al., "Particle Swann Optimization in Electromagnetics," IEEE Transactions on Antennas and Propagation, vol. 52, No. 2, Feb. 2004 (pp. 397-407).

A. Mekis, et al, "A Grating-coupler-enabled CMOS Photonics Platform," IEEE Journal of Selected Topics in Quantum Electronics, vol. 17, No. 3, May/Jun. 2011 (pp. 597-608).

\* cited by examiner

COMPACT AND LOW LOSS Y-JUNCTION FOR SUBMICRON SILICON WAVEGUIDE

CROSS-REFERENCE TO RELATED APPLICATIONS

This application is a continuation of U.S. patent application Ser. No. 14/834,597, filed Aug. 25, 2015, which is a continuation of and claims priority to U.S. patent application Ser. No. 14/093,263, filed Nov. 29, 2013, which claims the benefit of U.S. Provisional Application No. 61/731,502, filed Nov. 30, 2012, each of which is hereby incorporated by reference herein in its entirety.

STATEMENT REGARDING FEDERALLY FUNDED RESEARCH OR DEVELOPMENT

This invention was made with government support under Grant No FA9550-10-1-0053 awarded by the Air Force Office of Scientific Research (AFOSR). The government has certain rights in the invention.

FIELD OF THE INVENTION

The invention relates to optical waveguide components in general and particularly to a Y-junction for use with submicron silicon waveguides.

BACKGROUND OF THE INVENTION

The last decade witnessed series of break-throughs in silicon photonics. Key components such as the electrically pumped laser (see, for example, R. Camacho-Aguilera, et al, "An electrically pumped germanium laser," Opt. Express 20, 11316-11320 (2012)), the high-speed modulator (see, for example, G. T. Reed, G. Mashanovish, F. Y. Gardes and D. J. Thomson, "Silicon optical modulators," Nat. Photonics 4, 518-526 (2010)) and the photodetector (see, for example, J. Michel, J. Liu, and L. C. Kimerling, "High-performance Ge-on-Si photodetectors," Nat. Photonics, 4, 527-534 (2010)) have been successfully demonstrated. Foundry services are also becoming available to the community, making it easier to explore system level functionalities (see, for example, Y. Zhang, T. Baehr-Jones, R. Ding, T. Pinguet, Z. Xuan, M. Hochberg, "Silicon multi-project wafer platforms for optoelectronic system integration," Proc. 9th IEEE Intern. Conf. GFP, 2012, and the web sites of opsisfoundry.org and epixfab.eu). The intrinsic advantage of silicon as a photonic material system is its high refractive index contrast over silicon dioxide, allowing submicron waveguides and tight bends, as well as the state-of-the-art CMOS fabrication infrastructure developed by the electronics industry. However, these two advantages do not always go in parallel. For example, a Y-junction is theoretically lossless, while this is generally not the case due to limited resolution of micro fabrication. Sharp corners favored by photonics designs usually violate the minimum feature size rule of a CMOS process, which can be easily caught by design rule checking (DRC) routines. The possible detrimental effects of this violation in fabrication includes peeling off of photoresists, shallower etch in the narrow gap, and voids in subsequent oxide cladding deposition. All the above degrade device performance and lower yield.

A Y-junction formed by circular bends with a butt waveguide in between to avoid the sharp corner has over 1 dB insertion loss. Mach-Zehnder modulators having two such Y-branches readily have more than 2 dB insertion loss in the budget, regardless of other losses from free carrier absorption and on-and-off chip light coupling, making them less competitive to their III-V counterparts. In addition, complicated integrated optical circuits cannot be built on such lossy components. Moreover, the abrupt waveguide discontinuity causes light scattering and back-reflection. Implicit resonance cavities formed by these scattering sites degrade the system spectrum response.

As one the most basic building blocks, a low loss and compact Y-junction is very important for silicon photonic circuits. Recently a number of authors have demonstrated attractive device performance for Y-junctions (see, for example, A. Sakai, T. Fukazawa, and T. Baba, "Low loss ultra-small branches in a silicon photonic wire waveguide," IEICE Trans. Electron. E85-C, 1033-1038 (2002)), MMI couplers (see, for example, D. Van Thourhout, W. Bogaerts, P. Dumon, G. Roelkens, J. Van Campenhout, R. Baets, "Functional silicon wire waveguides," Proc. Integrated Photonics Research and Applications (2006)), cascaded splitters (see, for example, Z. Wang, Z. Fan, J. Xia, S. Chen and J. Yu, "1×8 cascaded multimode interference splitter in silicon-on-insulator," Jpn. J. Appl. Phys. 43, 5085-5087 (2004) and S. H. Tao, Q. Fang, J. F. Song, M. B. Yu, G. Q. Lo, and D. L. Kwong, "Cascaded wide-angle Y-junction 1×16 power splitter based on silicon wire waveguides on silicon-on-insulator," Opt. Express 16, 21456-21461 (2008)), photonic crystal 3 dB couplers (see, for example, L. H. Frandsen, et al, "Ultralow-loss 3 dB photonic crystal waveguide splitter," Opt. Lett. 29, 1623-1625 (2004)) and directional couplers (see, for example, H. Yamada, T. Chu, S. Ishida, and Y. Arakawa, "Optical directional coupler based on Si-wire waveguides," IEEE Photonics Technol. Lett. 17, 585-587 (2005)). However, a Y-junction with low excess loss, low wavelength sensitivity, small footprint, and dimensions clearly within the typical design rules of a modern CMOS photonics process has remained elusive.

The 1×3 power splitter function can be achieved by multi-mode interference (MMI) couplers or directional couplers. Usually these devices have large insertion loss, large footprint, high wavelength sensitivity or low compatibility with CMOS fabrication methods.

There is a need for an efficient Y-junction device that can be manufactured easily.

SUMMARY OF THE INVENTION

According to one aspect, the invention features a 1×2 power splitter for use in submicron silicon waveguides. The 1×2 power splitter comprises an input port configured to receive an optical signal having a power of substantially P watts; and a pair of output ports configured to provide substantially equal output signals each having a power of substantially P/2 Watts; the 1×2 power splitter having a footprint of less than 1.2 μm×2 μm in area.

In one embodiment, the input port has a taper width of 0.5 μm.

In another embodiment, at least one of the output ports has taper width of 0.5 μm.

In yet another embodiment, the 1×2 power splitter has a total output width of 1.2 μm.

In still another embodiment, the 1×2 power splitter has a minimum feature size of 200 nm.

In a further embodiment, the 1×2 power splitter is configured to be manufactured using a CMOS fabrication process.

In yet a further embodiment, the CMOS fabrication process is a process conducted using a 248 nm stepper.

In an additional embodiment, the CMOS fabrication process is a process conducted using a 193 nm stepper.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

We have designed a compact, low-loss and wavelength insensitive Y-junction for submicron silicon waveguide using FDTD and particle swarm optimization (PSO), and fabricated the device in a 248 nm CMOS line. We have measured an average insertion loss of 0.28±0.02 dB across an 8-inch wafer. The device footprint is less than 1.2 µm×2 µm, orders of magnitude smaller than MMI and directional couplers. The function of the invention is to provide a 1×2 power splitter for submicron silicon waveguides.

Our device has very low loss, small footprint, low wavelength sensitivity and was successfully fabricated by 248 nm CMOS with good cross-wafer uniformity.

The device can be part of a more complicated optoelectronic device, such as a Mach-Zehnder modulator, or a basic building block of integrated silicon photonic circuit.

The device can be a useful component of the process design kit (PDK) of a silicon photonics foundry. Companies commercializing silicon photonics technology, such as modulators and transceivers can also integrate this device in their products.

The device achieves low loss, compact, and wavelength insensitive 1×2 power splitting for submicron silicon waveguides. It interfaces with 500 nm×200 nm silicon waveguide. The power splitter can be readily inserted into other silicon photonic device or circuits as a basic building block. It can be used as a standard GDS cell, similar to p-cells in electronic circuit, such as transistors and resistors.

We modeled the electro-magnetic response of the structure using finite difference time domain (FDTD) method, and optimized the device geometry using particle swarm simulation (PSO).

We have designed and fabricated a Y-junction for submicron silicon waveguide with a taper less than 1.2 µm×2 µm, and cross-wafer average insertion loss 0.28±0.02 dB, comparable to the result demonstrated by electron beam lithography (EBL) and MMIs with much larger footprint. The coupling ratio is wavelength insensitive. The device has a minimum feature size of 200 nm, and successfully fabricated using 248 nm lithography.

Design and Fabrication

Design and Optimization

Figure 1A:
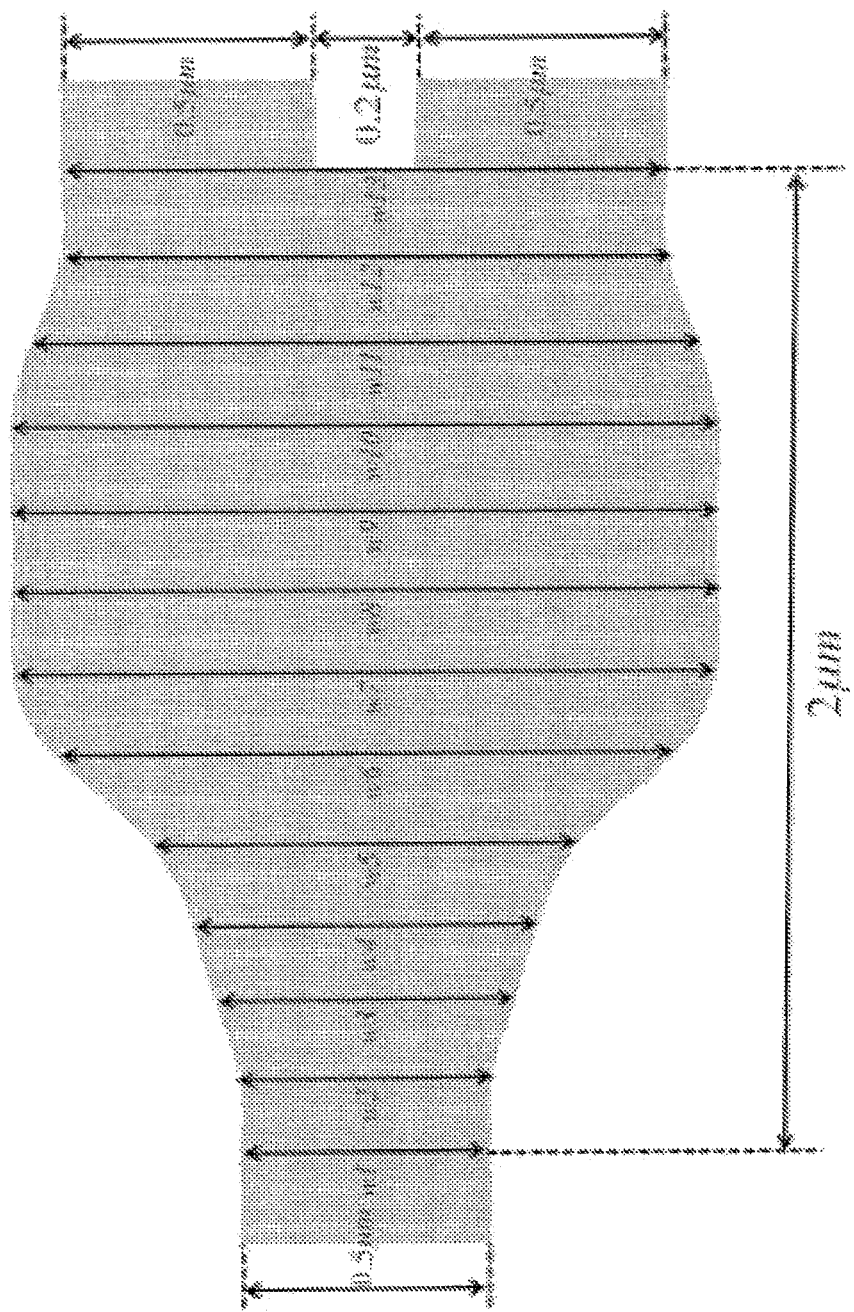
FIG. 1A is a schematic diagram of the device layout.

The goal was to design a compact, low loss and wavelength insensitive Y-junction for submicron silicon waveguide, compatible with typical CMOS photonic processes, where 193 nm or 248 nm steppers are commonly used. A minimum feature size of 200 nm was assumed during the design, which will not break the designs rules, thus ensure yield. Silicon waveguide geometry is 500 nm×220 nm. So the taper width is 0.5 µm at input and 1.2 µm at output, as shown in FIG. 1A. The length of the taper connecting input and output waveguides was set to 2 µm to keep the device compact. The size of Ge-on-Si photodetectors is usually on the order of 10 µm, and p-n junction modulator with phase shifter length of 50 µm has been demonstrated (see, for example, H. C. Nguyen, S. Hashimoto, M. Shinkawa and T. Baba, "Compact and fast photonic crystal silicon optical modulators," Opt. Express 20, 22465-22474 (2012)). A simple passive component like Y-junction should be compact enough to be part of a more complicated active device or an integrated optical circuit. The Y-junction is symmetric in the propagation direction to ensure balanced output at two branches.

The electromagnetic response of dielectric structures of size on the order of wavelength of interest can be simulated by Finite Difference Time Domain (FDTD) method. FDTD can be coupled with optimization algorithms to for design optimization. Sanchis et al demonstrated a waveguide crossing with 0.2 dB insertion loss and −40 dB cross-talk designed by FDTD and Genetic Algorithm (GA) (see, for example, P. Sanchis, et al, "Highly efficient crossing structure for silicon-on-insulator waveguides," Opt. Lett. 34, 2760-2762 (2009)). We utilized a different optimization algorithm, Particle Swarm Optimization (PSO), in this design. PSO is initially inspired by the social behavior of flocks of birds or schools of fish (see, for example, J. Kennedy and R. Eberhart, "Particle swarm optimization," Proc. IEEE Intern. Conf. Neural Networks (1995)), and has been successfully applied to electromagnetic optimization problems (see, for example, J. Robinson and Y. Rhamat-Samii, "Particle swarm optimization in electromagnetics," IEEE Trans. Antennas Propag. 52, 397-407 (2004)). In PSO, the potential solutions, called particles or agents, are initialized at random positions with random velocities in the parameter space. A figure of merit function is defined to evaluate the particle position according to the optimization goal. The best position for each individual particle is recorded, as well as a global best position ever achieved by any particle in the swarm. The position of a particle is updated by the following equation, $$x_n = x_n + \Delta t * v_n \quad (1)$$

$$v_n = \omega * v_n + c_1 * \text{rand}(\ ) * (p_{best,n} - x_n) + c_2 * \text{rand}(\ ) * (g_{best,n} - x_n) \quad (2)$$

where $v_n$ and $x_n$ are particle's velocity and position in nth dimension of the parameter space, and $p_{best,n}$ and $g_{best,n}$ are individual and global best positions. As is apparent from Eq. 2, the new velocity is the old velocity scaled by $\omega$ and increased the direction of $p_{best,n}$ and $g_{best,n}$.

$\omega$, known as the inertial weight, is a measurement of how much a particle would like to stay at the old velocity. $c_1$ determines how much a particle is influenced by the memory of its best position, thus sometimes called cognitive rates. And $c_2$ is a factor demining how much the particle is affected by the global best position of the whole swarm, hence called social rates. The two random numbers are used to simulate the unpredictable behavior of natural swarm. It can be seen that the particle velocity is large when it is far from $p_{best,n}$ and $g_{best,n}$, becomes smaller as it is closer to the best position and gets pulled back after flying over. The optimization is stopped when the figure of merit is good enough or a large number of iteration is reached.

FIG. 1A is a schematic diagram of the device layout.

Figure 1B:
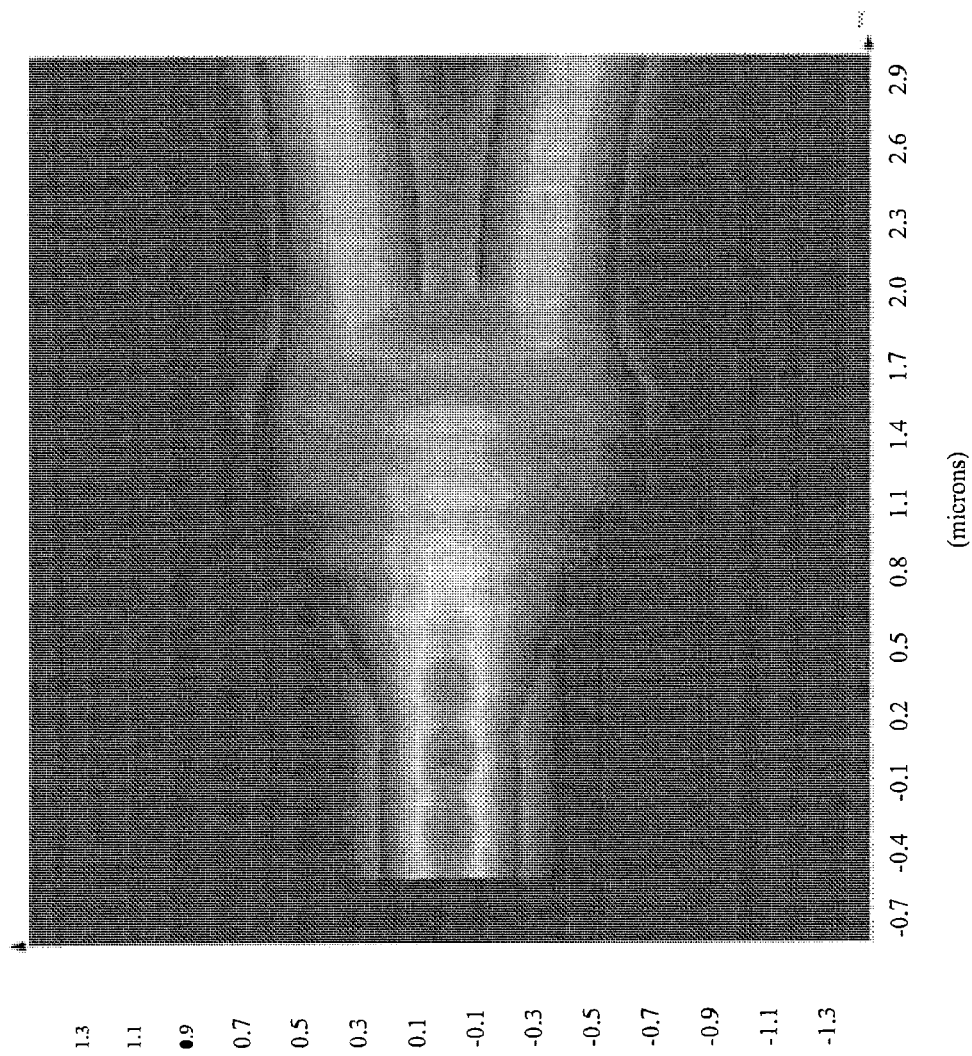
FIG. 1B is a diagram showing the contour plot of the simulated electric field intensity distribution at 1550 nm wavelength.

FIG. 1B is a diagram showing the contour plot of the simulated electric field intensity distribution at 1550 nm wavelength.

In this design, the taper was first digitalized into 13 segments of equal length. The width of each segment, labeled as w1 to w13 in FIG. 1A, was optimized to achieve low loss coupling. Taper geometry is defined by spline interpolation of these 13 points. The optimization figure of merit (FOM) was the power in TE0 mode at either branch. It was calculated by the overlap integral of TE0 mode of a 500 nm×220 nm waveguide with the detected field at the output branch. Note that it is not proper to set the total detected power to be FOM, since higher order modes will leak out of the waveguide along the way. Maximizing the power effectively reduced the scattering and back-reflection. The swarm population was set to 30. 2D FDTD was used as an approximation of 3D FDTD for computation efficiency during optimization. A commercially available code wad used (available from http://www.lumerical.com/tcad-products/fdtd/ [16]. Within 50 iterations, one solution with sub-0.2 dB insertion loss emerged, as shown in Table 1. Then 3D FDTD was run on this solution to double check the result with a mesh equal to 1/34 of the free space wavelength. The insertion loss was deermined to be 0.13 dB. No noticeable scattering is seen in the contour plot of electric field intensity as shown in FIG. 1b. There is an interference pattern at the input end, indicating non-zero back-reflection. Due to the root square relationship between field magnitude and optical intensity, very weak back-reflection is necessary to create clear interference patterns. The normalized transmission and reflection power as a function of wavelength is plotted in FIG. 2A and FIG. 2B. It can be seen that both the transmission and reflection are wavelength insensitive, with variation below 1% and 0.5% over wavelength range from 1500 nm to 1580 nm.

TABLE 1

| Taper width in μm | | | | | | | | | | | | |
|---|---|---|---|---|---|---|---|---|---|---|---|---|
| w1 | w2 | w3 | w4 | w5 | w6 | w7 | w8 | w9 | w10 | w11 | w12 | 13 |
| 0.5 | 0.5 | 0.6 | 0.7 | 0.9 | 1.26 | 1.4 | 1.4 | 1.4 | 1.4 | 1.31 | 1.2 | 1.2 |

Figures 2A, 2B:
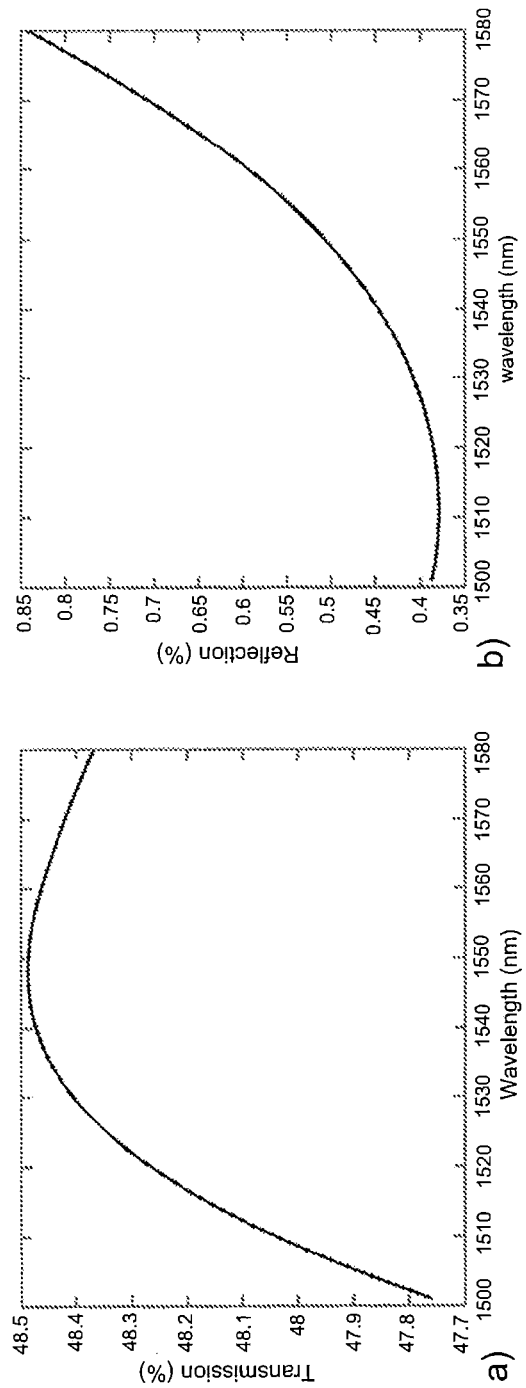
FIG. 2A is a graph showing the simulated power transmission as a function of wavelength.
FIG. 2B is a graph showing the simulated reflection as a function of wavelength.

FIG. 2A is a graph showing the simulated power transmission as a function of wavelength.

FIG. 2B is a graph showing the simulated reflection as a function of wavelength.

Device Fabrication

Figures 3A, 3B:
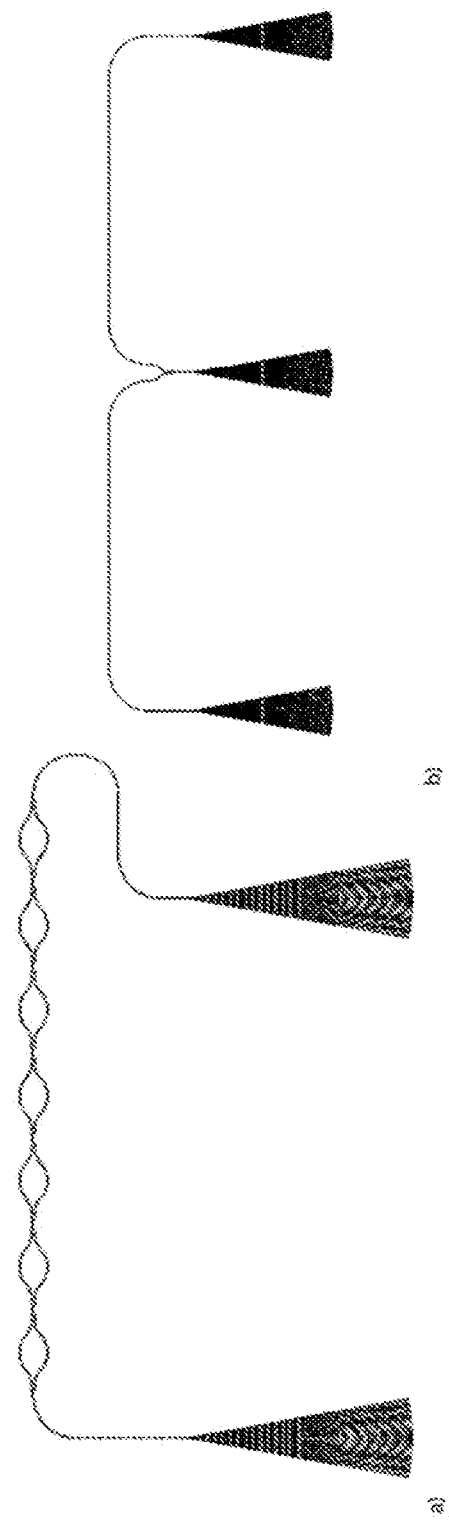
FIG. 3A is a diagram showing the Y-junction characterization structure for a plurality of cascaded Mach-Zehnder structures to measure insertion loss.
FIG. 3B is a diagram showing the Y-junction characterization structure for a single Y-junction to measure coupling ratio and spectrum response.

Starting substrate was an 8-inch SOI wafer, with 220 nm, 10 ohm-cm p-type top silicon film, 2 μm buried oxide on top of a silicon handle. Waveguides were patterned using 248 nm UV lithography followed by dry etching. Then a few microns of oxide were deposited as top cladding. Light coupling on and off chip was achieved by grating couplers (GC). Two kinds of characterization structures are laid out, as shown in FIG. 3A and FIG. 3B. A cascade of Mach-Zehnder structures formed by butt coupled Y-junctions were used to measure the insertion loss, similar those used in A. Mekis, et al, "A grating-coupler-enabled CMOS photonics platform," IEEE J. Sel. Top. Quantum Electron. 17, 597-608 (2011). The other structure has the three terminals of the Y-junction connected to three grating couplers to measure the output directly. In both cases, the bend radius of waveguide is 10 μm. And grating coupler pitch is 127 μm, determined by the pitch of fiber array. Simple GC loops, i.e. two GCs connected by a U-turn waveguide, were used as a reference structure. Tiles used around the devices to achieve a certain filling ratio are not shown.

FIG. 3A is a diagram showing the Y-junction characterization structure for a plurality of cascaded Mach-Zehnder structures to measure insertion loss.

FIG. 3B is a diagram showing the Y-junction characterization structure for a single Y-junction to measure coupling ratio and spectrum response.

Results and Discussion

Testing Configuration

Devices were measured on a wafer scale setup that can map the wafer coordinate to the stage coordinate, so that any device can be easily probed after initial alignment. Light from a tunable laser was coupled into the device under test (DUT) via a though a polarization maintaining (PM) fiber and grating coupler, then to a photodetector through another grating coupler and PM fiber. Chuck temperature was set to 35° C., slightly higher than room temperature. The device performance reported in this paper is not expected as a strong function of temperature. Reticle size on the wafer is 2.5 cm×3.2 cm. Test structures shown in FIG. 3A and FIG. 3B in each die were tested to characterize the cross-wafer performance.

Figures 4A, 4B:
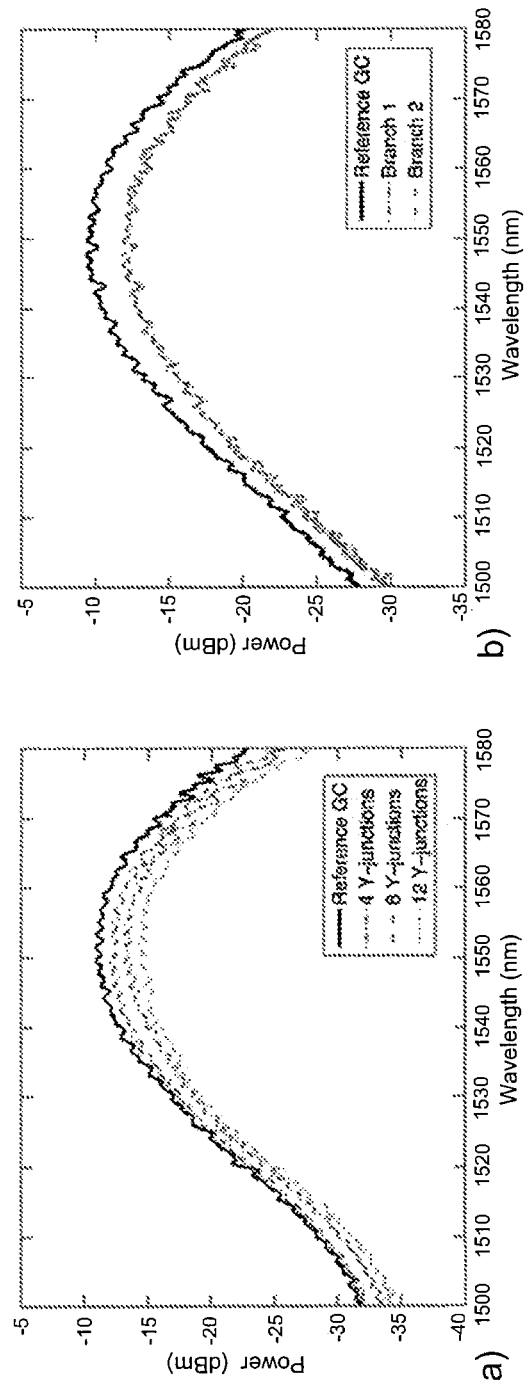
FIG. 4A is a graph showing the typical measured spectra of the test structure in FIG. 3A for different numbers of cascaded Mach-Zehnders.
FIG. 4B is a graph showing the typical measured spectra of the test structure in FIG. 3B.

FIG. 4A is a graph showing the typical measured spectra of the test structure in FIG. 3A for different numbers of cascaded Mach-Zehnders.

FIG. 4B is a graph showing the typical measured spectra of the test structure in FIG. 3B.

Typical spectra structures in FIG. 3A and FIG. 3B are shown in FIG. 4A and FIG. 4B respectively. The parabolic-like shape is determined by the grating coupler spectrum response. The grating coupler design used here works only for TE mode and is highly polarization selective. Due to the non-perfect polarization of input light, fringes appear on the spectra. The fringes are usually 0.5 dB peak to peak, and can be reduced by using a polarization controller.

Device Performance

It is difficult to measure sub-0.5 dB insertion loss from a single device. Therefore, test structures with different numbers of Y-junctions in the loop were used to figure out the insertion loss. The measured peak power as a function of number of Y-junctions in the loop is plotted in FIG. 5A. Dots are test data, and the line is linear fitting. The slope of the line gives insertion loss in dB per Y-junction. Loop baseline losses, such as grating coupler insertion loss, are the same for all structures, thus won't affect the slope of the fitting line. We measured the insertion loss of all Y-junctions across the wafer.

Figure 5A:
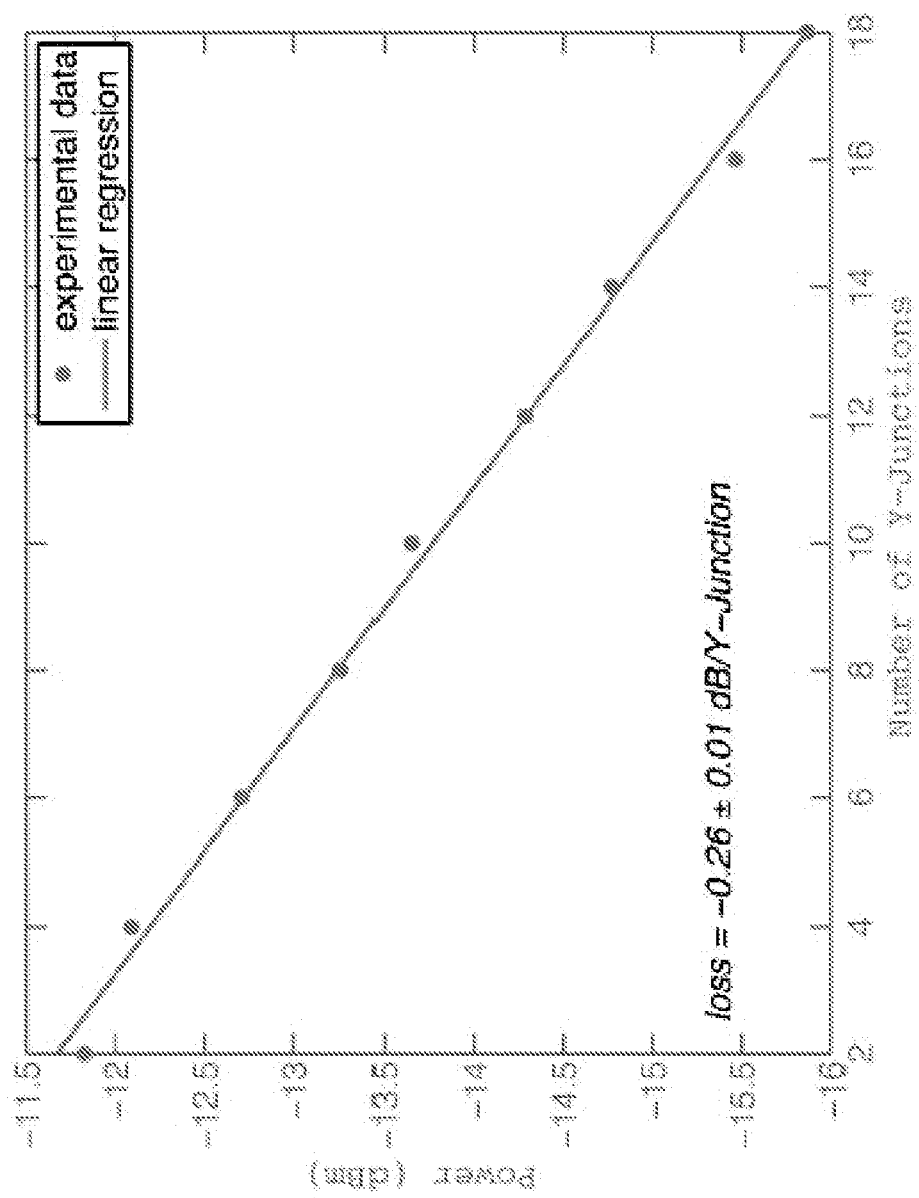
FIG. 5A is a graph of power loss as a function of the number of Y-junctions in a cascade. The dots are measured peak optical power from test structure in shown FIG. 3A on Die (0,0). The line is a linear fitting curve.
Figure 5B:
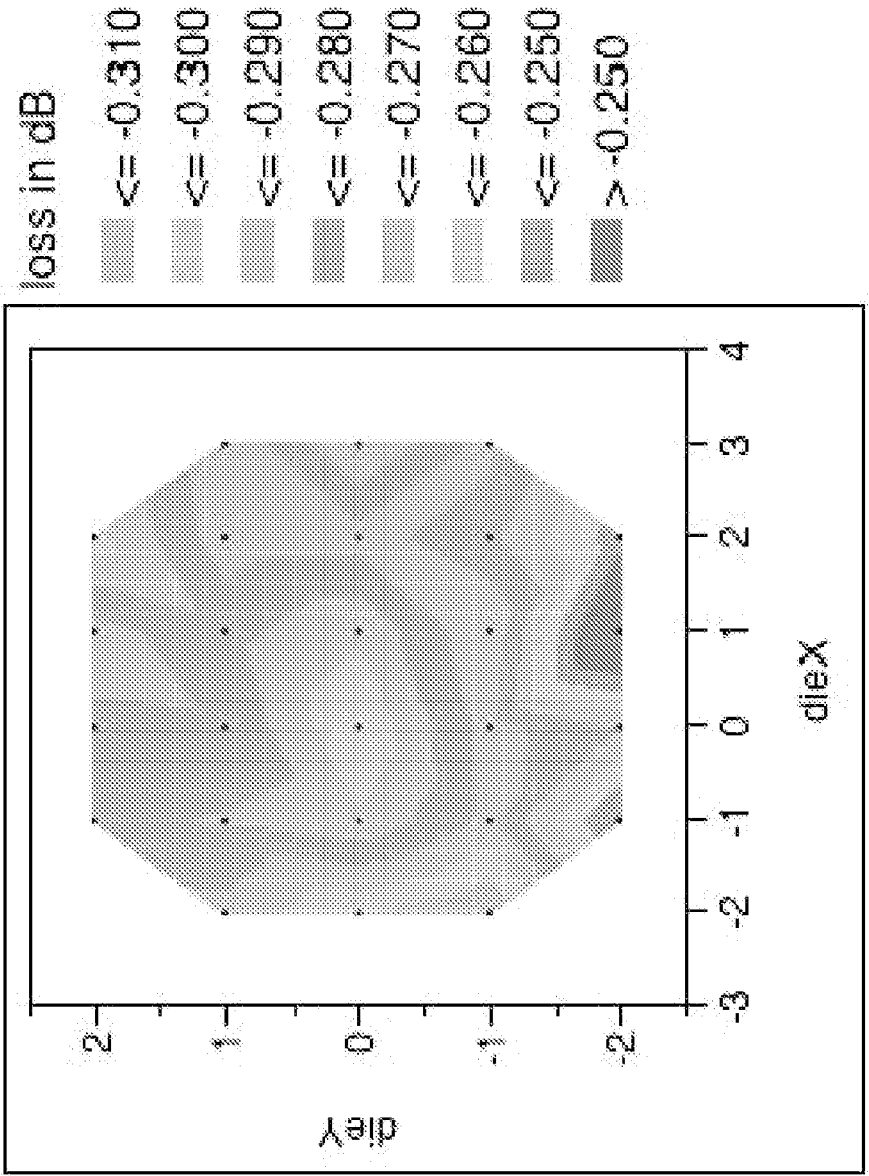
FIG. 5B is a plot of the measured cross-wafer insertion loss of Y-junctions.

A contour plot of insertion loss is shown in FIG. 5B. From the contour, we can see that our device performance is uniform across the wafer, with an average of 0.28±0.02 dB. Low cross-wafer variation confirms that our device is not fabrication sensitive, and can be reliable component of an integrated photonic system.

We also note that the spectra of characterization structures in FIG. 4A do not deviate from a reference GC spectrum, with only a linear offset in y-axis, even with a large number of Y-junctions in the loop. This validates our estimation that although there is an interference pattern in FIG. 1B the back-reflection is negligible and won't degrade the system spectrum response.

It is shown in S. H. Tao, Q. Fang, J. F. Song, M. B. Yu, G. Q. Lo, and D. L. Kwong, "Cascaded wide-angle Y-junction 1×16 power splitter based on silicon wire waveguides on silicon-on-insulator," Opt. Express 16, 21456-21461 (2008) that etch residues or air voids in the gap defined by sharp corners in the layout will lead to non-uniform output at two branches of the Y-junction. In FIG. 4B, the spectra of two branches overlaps over the whole testing wavelength range, indicating balanced output power. So our design fully addressed the DRC violation issue of conventional Y-junctions.

The spectra in FIG. 4A and FIG. 4B also validate the simulation results in FIG. 2A and FIG. 2B, that the device performance is wavelength insensitive.

FIG. 5A is a graph of power loss as a function of the number of Y-junctions in a cascade. The dots are measured peak optical power from test structure in shown FIG. 3A on Die (0,0). The line is a linear fitting curve.

FIG. 5B is a plot of the measured cross-wafer insertion loss of Y-junctions.

Design Methodology

Our result also confirms PSO as an efficient optimization algorithm for silicon photonic device design and optimization. We utilized moderate swarm population and iteration cycle. It is possible that even better device geometry will emerge with more dedicated optimization. This design method can be readily used address other challenges such as non-uniform grating couplers and distributed brag gratings (DBRs).

Optical Waveguides and Their Uses

We have described various optical waveguide systems and application, as well as fabrication techniques for such waveguides in a number of patent documents, including U.S. Pat. Nos. 7,200,308, 7,424,192, 7,480,434, 7,643,714, and 7,760,970.

Definitions

Unless otherwise explicitly recited herein, any reference to an electronic signal or an electromagnetic signal (or their equivalents) is to be understood as referring to a non-volatile electronic signal or a non-volatile electromagnetic signal.

Recording the results from an operation or data acquisition, such as for example, recording results at a particular frequency or wavelength is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use, so that the result can be displayed, recorded to a non-volatile memory, or used in further data processing or analysis.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A submicron optical splitter device comprising:
   an input port for inputting a beam of light in a propagation direction;
   first and second output ports for outputting first and second portions of the beam of light;
   a tapered section divided into a plurality of segments between the input port and the output port;
   wherein the segments increase in width from the input port to a maximum width proximate a half-way point of the tapered section;
   wherein the segments decrease in width towards the first and second output ports, whereby the maximum width is greater than the width of the segment proximate the two output ports.

2. The device according to claim 1, wherein a plurality of adjacent segments proximate the half way point comprise the same maximum width.

3. The device according to claim 2, wherein the plurality of adjacent segments comprises four segments.

4. The device according to claim 2, wherein the input port and the first and second output ports each has a width of 0.5 um.

5. The device according to claim 4, further comprising a gap between the first and second output ports; wherein the gap has a width of 0.2 um.

6. The device according to claim 5, wherein the maximum width is 1.4 um.

7. The device according to claim 3, wherein a total length of the plurality of segments is 2 um.

8. The device according to claim 1, wherein the tapered section is symmetrical about the propagation direction to ensure balanced output at the first and second output ports.

9. The device according to claim 1, wherein the plurality of segments comprises at least 13 segments.

10. The device according to claim 1, wherein the plurality of segments comprises segments of equal length.

11. The device according to claim 1, wherein the tapered section comprises silicon with a silicon oxide cladding.

* * * * *